United States Patent
Iwao et al.

(10) Patent No.: US 9,329,483 B2
(45) Date of Patent: May 3, 2016

(54) FILM FORMING METHOD, NON-TRANSITORY COMPUTER STORAGE MEDIUM AND FILM FORMING APPARATUS

(71) Applicant: Tokyo Electron Limited, Tokyo (JP)

(72) Inventors: Fumiko Iwao, Nirasaki (JP); Satoru Shimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 124 days.

(21) Appl. No.: 14/098,653

(22) Filed: Dec. 6, 2013

(65) Prior Publication Data

US 2014/0170332 A1    Jun. 19, 2014

(30) Foreign Application Priority Data

Dec. 17, 2012    (JP) .................................. 2012-274863

(51) Int. Cl.
*B05D 3/00* (2006.01)
*C08J 7/18* (2006.01)
*G03F 7/16* (2006.01)

(52) U.S. Cl.
CPC ...................................... *G03F 7/168* (2013.01)

(58) Field of Classification Search
CPC ........... C23C 18/04; C23C 18/31; G03F 7/20; G03F 7/38; G03F 7/40; G03F 7/168
See application file for complete search history.

(56) References Cited

U.S. PATENT DOCUMENTS

| | | | |
|---|---|---|---|
| 6,017,683 | A | 1/2000 | Endo et al. |
| 2002/0036183 | A1 | 3/2002 | Shibata |
| 2004/0081762 | A1* | 4/2004 | Tsushima ............... C08L 83/16 427/304 |
| 2012/0152752 | A1 | 6/2012 | Keigler et al. |
| 2014/0255844 | A1 | 9/2014 | Iwao et al. |
| 2014/0255852 | A1 | 9/2014 | Iwao et al. |

FOREIGN PATENT DOCUMENTS

| | | |
|---|---|---|
| EP | 1 375 699 A1 | 1/2004 |
| JP | H04-151668 A | 5/1992 |
| JP | H07-326562 A | 12/1995 |
| JP | 08-076385 A | 3/1996 |
| JP | 09-189998 A | 7/1997 |
| JP | 2000-243741 A | 9/2000 |
| JP | 2001-272786 A | 10/2001 |
| JP | 2003-519434 A | 6/2003 |
| JP | 2005-322765 A | 11/2005 |
| JP | 2010-278254 A | 12/2010 |
| JP | 2012-022244 A | 2/2012 |
| WO | 00/01010 A2 | 1/2000 |

OTHER PUBLICATIONS

Office Action mailed May 7, 2015 in related co-pending U.S. Appl. No. 14/177,322.
Office Action dated Oct. 6, 2014 issued in co-pending U.S. Appl. No. 14/188,774.
Final Office Action dated Jan. 16, 2015 issued in co-pending U.S. Appl. No. 14/188,774.

* cited by examiner

*Primary Examiner* — Michael Wieczorek
(74) *Attorney, Agent, or Firm* — Posz Law Group, PLC

(57) ABSTRACT

To appropriately form a metal-containing film containing metal on a substrate, a method first forms an organic film on the substrate, and causes a treatment agent to enter the organic film and causes metal to infiltrate the organic film via the treatment agent, thereby forming the metal-containing film. The metal-containing film contains metal and thus has a high etching selection ratio that is originally required performance. This makes it possible to appropriately form the metal-containing film having a high etching selection ratio on the substrate.

9 Claims, 15 Drawing Sheets

FILM FORMING METHOD, NON-TRANSITORY COMPUTER STORAGE MEDIUM AND FILM FORMING APPARATUS

BACKGROUND OF THE INVENTION

1. Field of the Invention

The present invention relates to a film forming method of forming a metal-containing film on a substrate, a non-transitory computer storage medium, and a film forming apparatus for executing the film forming method.

This application is based upon and claims the benefit of priority of the prior Japanese Patent Application No. 2012-274863, filed in Japan on Dec. 17, 2012, the entire contents of which are incorporated herein by reference.

2. Description of the Related Art

In a photolithography process in a manufacturing process of a semiconductor device, for example, a resist coating treatment of applying a resist solution onto a semiconductor wafer (hereinafter, referred to as a "wafer") to form a resist film, exposure processing of irradiating the resist film on the wafer front surface with light in a predetermined pattern to expose the resist film, a developing treatment of developing the inside of the exposed resist film and so on are performed in sequence to form a predetermined resist pattern in the resist film on the wafer front surface.

The semiconductor device in recent years is miniaturized to be, for example, 20 nm or less, and the above-described resist pattern is desired to be miniaturized. To cope with the miniaturization of the resist pattern, a so-called multi-patterning in which a plurality of times of resist coating treatment, exposure processing and developing treatment are performed, for example, in the photolithography process is discussed. However, the process of the multi-patterning is complicated, so that when performing etching treatment using a resist pattern formed by the multi-patterning, it becomes more difficult to secure the precision of the etching technique.

Hence, to improve the precision of the etching technique, it is discussed that a metal hard mask film capable of providing an etching selection ratio with respect to a film to be etched is formed as a lower layer of the resist film. The metal hard mask film is a film containing a metal component in an organic film (Japanese Laid-open Patent Publication No. 2001-272786).

Further, for forming the metal hard mask film, it is discussed to employ a so-called spin coating method in terms of cost, flatness of the film and so on. In the spin coating method, a metal hard mask material is applied to the front surface of the wafer by supplying the metal hard mask material onto the wafer during rotation and diffusing the metal hard mask material on the wafer by the centrifugal force.

Incidentally, for example, in a semiconductor device in a multilayer wiring structure, a predetermined pattern of a $SiO_2$ film or the like has been formed on the wafer in some cases. When trying to form on the wafer on which the predetermined pattern has been formed a metal hard mask film using the aforementioned spin coating method, it is impossible to cause the metal hard mask material to appropriately enter grooves of the pattern because the metal hard mask material has a metal component and is poor in fluidity. Along with the miniaturization of the pattern in recent years, the problem of the embedding property of the metal hard mask material becomes prominent. Further, the pattern may be broken at the time of embedding due to the material stress of the metal hard mask material. When the metal hard mask material is not appropriately embedded as described above, it is impossible to appropriately form a metal hard mask film.

The present invention has been made in consideration of the above points and its object is to appropriately form a metal-containing film containing metal on a substrate.

SUMMARY OF THE INVENTION

To achieve the above object, the present invention is a film forming method of forming a metal-containing film on a substrate, including: an organic film forming step of forming an organic film on the substrate; and a metal-containing film forming step of forming a metal-containing film by causing a treatment agent to enter the organic film and causing metal to infiltrate the organic film via the treatment agent.

According to the present invention, when applying an organic solution onto the substrate, for example, using the spin coating method in the organic film forming step, it is possible, even if a predetermined pattern has been formed on the substrate, to cause the organic solution to appropriately enter grooves of the pattern because the organic solution is excellent in fluidity and embedding property. Therefore, it is possible to appropriately form the organic film on the substrate. Further, by causing the treatment agent to enter the organic film in the metal-containing film forming step, it becomes possible to cause the metal to enter the organic film using the treatment agent as an entrance route. Thus, a metal-containing film in which the metal infiltrates the organic film is formed on the substrate. In addition, the metal-containing film contains the metal and therefore has a high etching selection ratio that is originally required performance. As described above, according to the present invention, the metal-containing film having a high etching selection ratio can be appropriately formed on the substrate.

The present invention according to another aspect is a non-transitory computer readable storage medium storing a program running on a computer of a control unit that controls a film forming apparatus to cause the film forming apparatus to execute the film forming method.

The present invention according to still another aspect is a film forming apparatus for forming a metal-containing film on a substrate, including: an organic film forming unit configured to form an organic film on the substrate; and a metal-containing film forming unit configured to form a metal-containing film by causing a treatment agent to enter the organic film and causing metal to infiltrate the organic film via the treatment agent.

According to the present invention, a metal-containing film having a high etching selection ratio can be appropriately formed on a substrate.

DETAILED DESCRIPTION OF THE INVENTION

Figure 1:
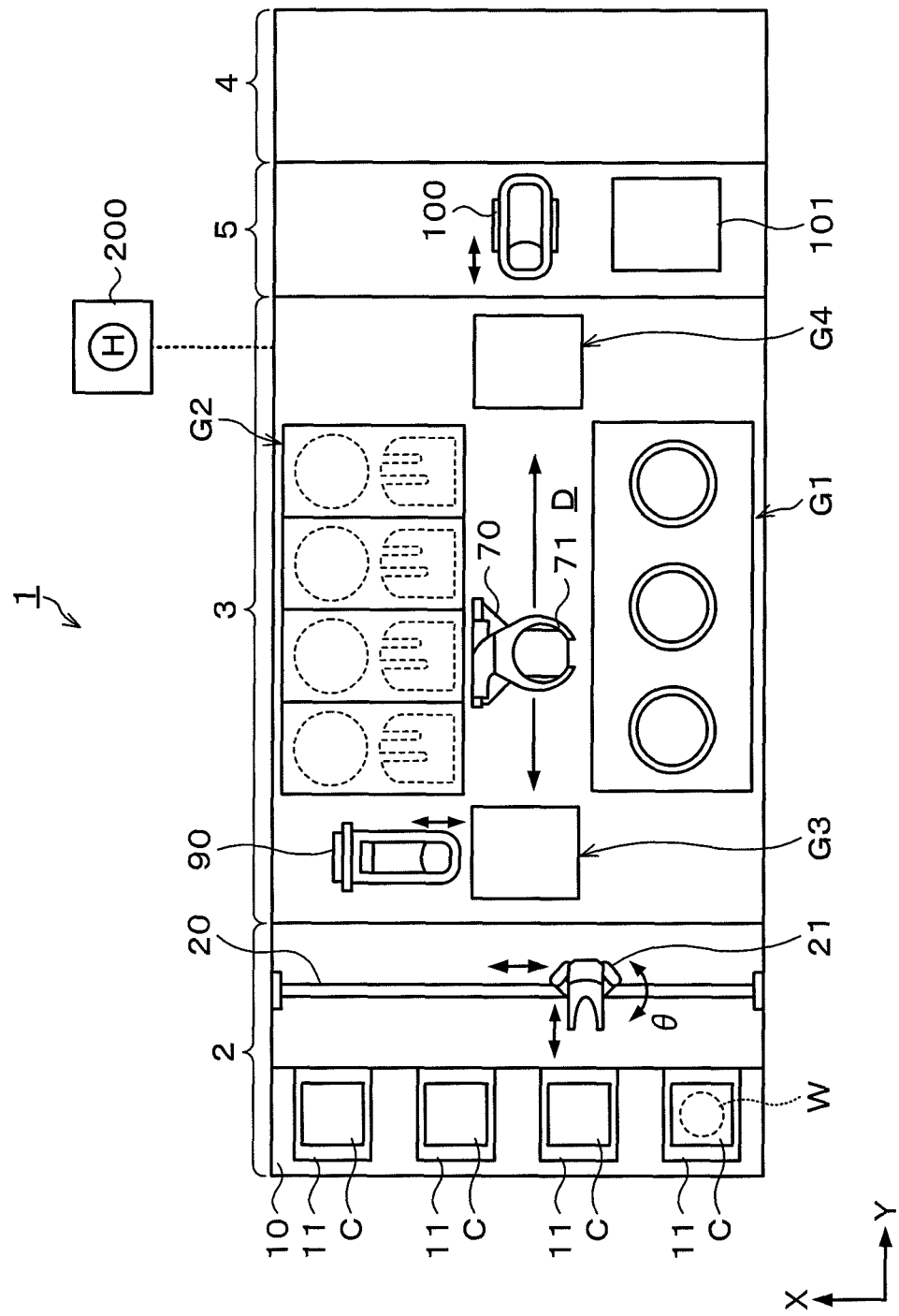
FIG. 1 is a plan view illustrating the outline of an internal configuration of a coating and developing treatment system according to an embodiment.
Figure 2:
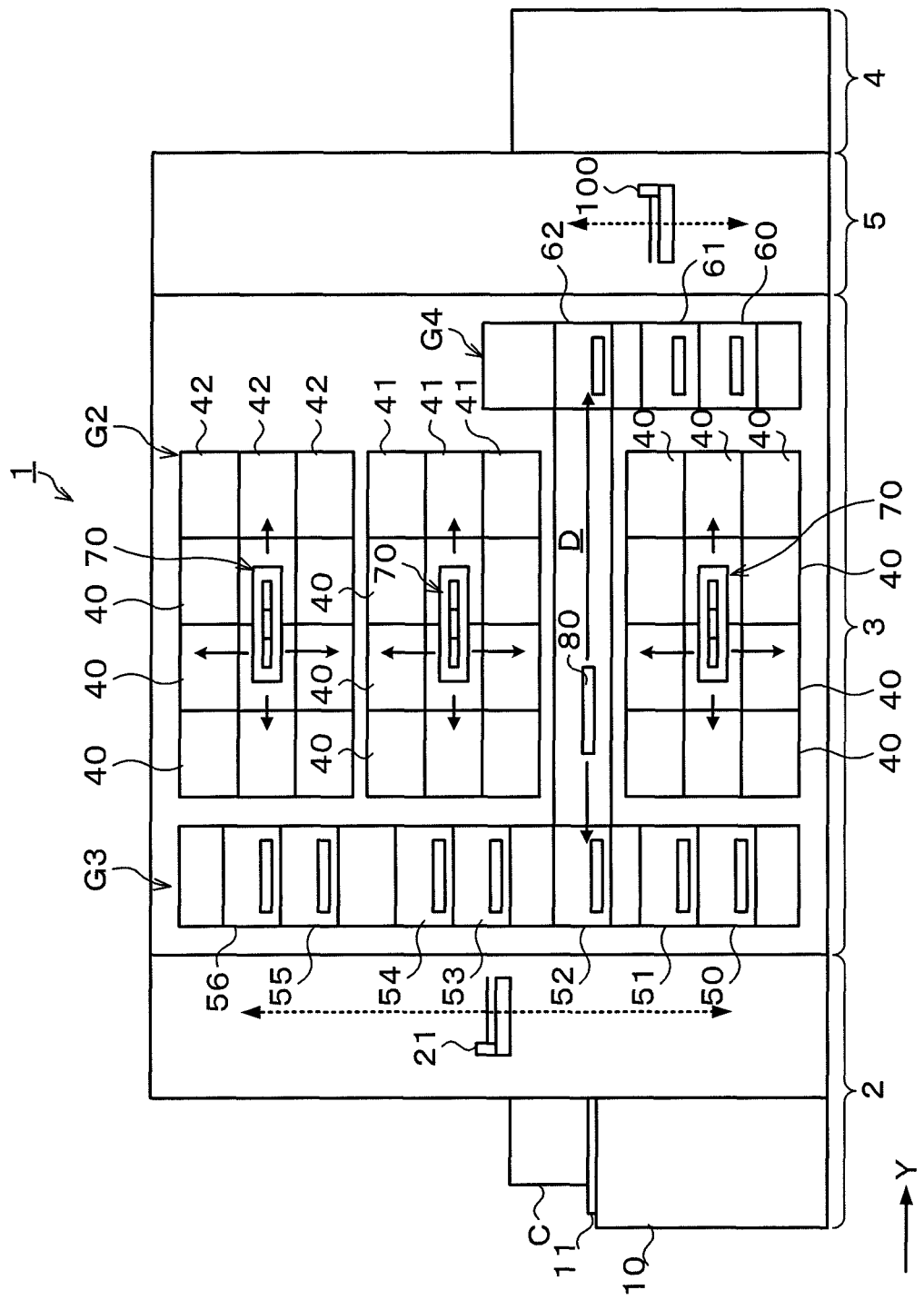
FIG. 2 is a side view illustrating the outline of the internal configuration of the coating and developing treatment system.
Figure 3:
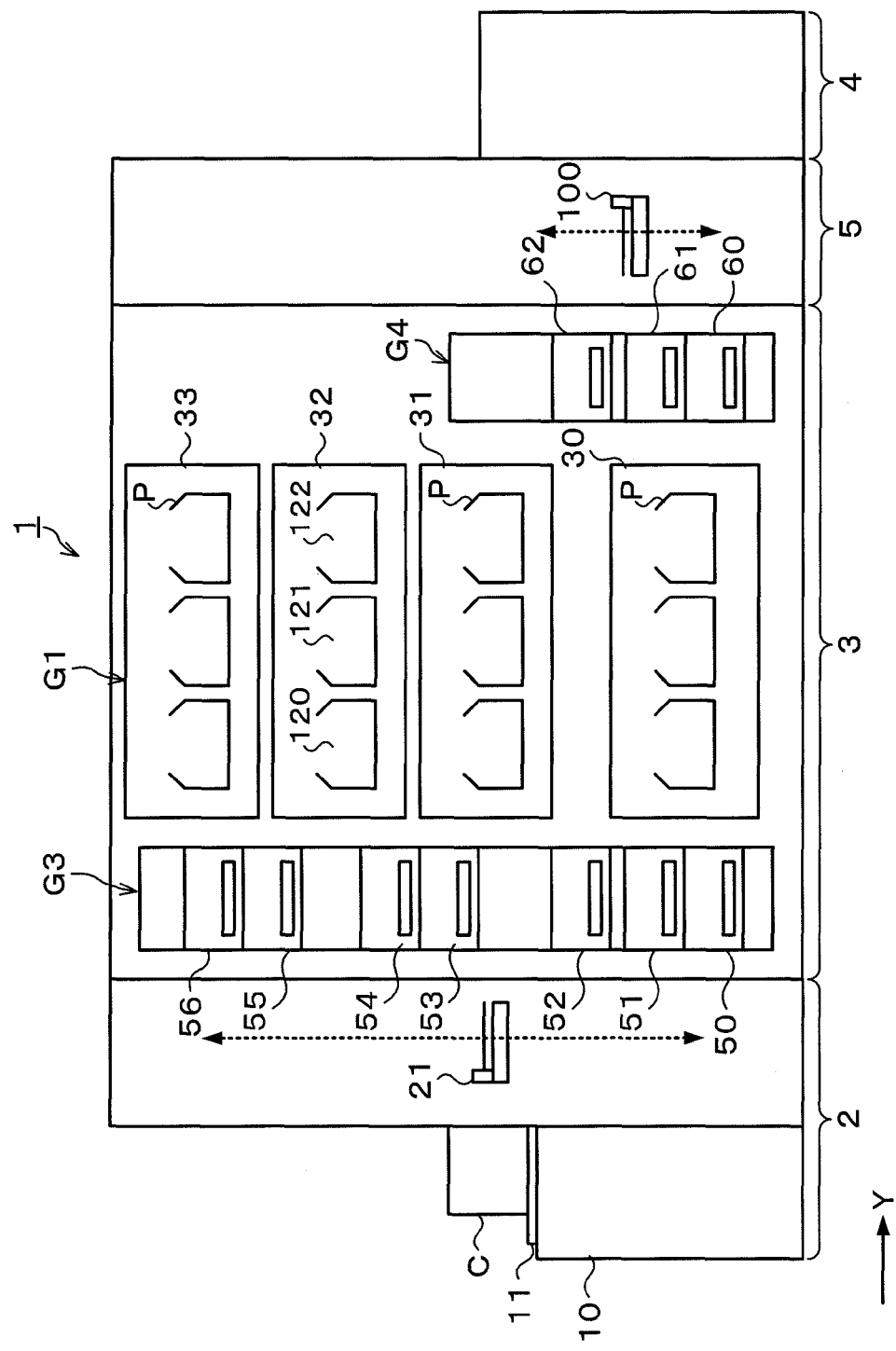
FIG. 3 is a side view illustrating the outline of the internal configuration of the coating and developing treatment system.

Hereinafter, an embodiment of the present invention will be described. FIG. 1 is a plan view illustrating the outline of an internal configuration of a coating and developing treatment system 1. FIG. 2 and FIG. 3 are side views illustrating the outline of the internal configuration of the coating and developing treatment system 1. Note that the coating and developing treatment system 1 functions as a film forming apparatus in the present invention, and a later-described coating treatment apparatus functions as a film forming apparatus particularly in this embodiment.

The coating and developing treatment system 1 has, as illustrated in FIG. 1, a configuration in which, for example, a cassette station 2 into which a cassette C housing a plurality of wafers W is transferred in/taut from/to, for example, the outside, a treatment station 3 including a plurality of various kinds of treatment apparatuses that perform predetermined treatments in a manner of single wafer treatment in the photolithography processing, and an interface station 5 that delivers the wafer W to/from an exposure apparatus 4 adjacent to the treatment station 3, are integrally connected.

In the cassette station 2, a cassette mounting table 10 is provided. The cassette mounting table 10 is provided with, a plurality of, for example, four cassette mounting plates 11. The cassette mounting plates 11 are provided, arranged side by side in a line in an X-direction (a top and bottom direction in FIG. 1) being the horizontal direction. On the cassette mounting plates 11, cassettes C can be mounted when the cassettes C are transferred in/out from/to the outside of the coating and developing treatment system 1.

In the cassette station 2, a wafer transfer apparatus 21 is provided which is movable on a transfer path 20 extending in the X-direction as illustrated in FIG. 1. The wafer transfer apparatus 21 is movable also in the vertical direction and around a vertical axis (in a θ-direction), and can transfer the wafer W between the cassette C on each of the cassette mounting plates 11 and a later-described delivery apparatus in a third block G3 in the treatment station 3.

In the treatment station 3, a plurality of, for example, four blocks G1, G2, G3, G4 are provided each including various apparatuses. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (a Y-direction negative direction side in FIG. 1) in the treatment station 3, and the fourth block G4 is provided on the interface station 5 side (a Y-direction positive direction side in FIG. 1) in the treatment station 3.

In the first block G1, as illustrated in FIG. 3, a plurality of solution treatment apparatuses are stacked in the vertical direction. For example, a developing treatment apparatus 30 that performs developing treatment on the wafer W, a lower anti-reflection film forming apparatus 31 that forms an anti-reflection film under a metal-containing film and a resist film of the wafer W (hereinafter, referred to as a "lower anti-reflection film"), a coating treatment apparatus 32 that applies predetermined solutions to the wafer W to form a metal-containing film and a resist film, and an upper anti-reflection film forming apparatus 33 that forms an anti-reflection film over the metal-containing film and the resist film of the wafer W (hereinafter, referred to as an "upper anti-reflection film"), are four-tiered in order from the bottom.

Each of the developing treatment apparatus 30, the lower anti-reflection film forming apparatus 31, and the upper anti-reflection film forming apparatus 33 has a plurality of cups P, each of which houses the wafer W therein at treatment, in the horizontal direction and can treat a plurality of wafers W in parallel. The detailed configuration of the coating treatment apparatus 32 will be described later.

Note that a protective film forming apparatus that supplies a treatment solution for forming a water repellent protective film to the wafer W to form a protective film for exposure, a rear surface cleaning apparatus that supplies a cleaning solution to the rear surface of the wafer W and a beveled portion at the edge to clean the rear surface of the wafer W, and the like may be arranged in the first block G1.

For example, in the second block G2, as illustrated in FIG. 2, thermal treatment apparatuses 40 each of which performs heat treatment on the wafer W, adhesion apparatuses 41 each of which performs hydrophobic treatment on the wafer W, and edge exposure apparatuses 42 each of which exposes the outer peripheral portion of the wafer W are arranged one on top of the other in the vertical direction and side by side in the horizontal direction. The thermal treatment apparatus 40 has a thermal plate that mounts and heats the wafer W thereon and a cooling plate that mounts and cools the wafer W thereon, and thereby can perform both of heat treatment and cooling treatment. Note that the numbers and the arrangement of the thermal treatment apparatuses 40, adhesion apparatuses 41, and edge exposure apparatuses 42 can be arbitrarily selected.

For example, in the third block G3, a plurality of delivery apparatuses 50, 51, 52, 53, 54, 55, 56 are provided in order from the bottom as illustrated in FIG. 2 and FIG. 3. Further, in the fourth block G4, a plurality of delivery apparatuses 60, 61, 62, are provided in order from the bottom.

A wafer transfer region D is formed in a region surrounded by the first block G1 to the fourth block G4 as illustrated in FIG. 1. In the wafer transfer region D, for example, a wafer transfer apparatus 70 is arranged.

The wafer transfer apparatus 70 has a transfer arm 71 that is movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

A plurality of the wafer transfer apparatuses 70 are arranged, for example, one above the other as illustrated in FIG. 2 and can transfer the wafers W, for example, to predetermined apparatuses in the blocks G1 to G4 at about the same levels as them.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction. The shuttle transfer apparatus 80 can move in the Y-direction while supporting the wafer W and transfer the wafer W between the delivery apparatus 52 in the third block G3 and the delivery apparatus 62 in the fourth block G4.

As illustrated in FIG. 1, a wafer transfer apparatus 90 is provided on the X-direction positive direction side of the third block G3. The wafer transfer apparatus 90 has a transfer arm that is movable, for example, in the X-direction, the θ-direction, and the vertical direction. The wafer transfer apparatus 90 can move up and down while supporting the wafer W to transfer the wafer W to each of the delivery apparatuses in the third block G3.

In the interface station 5, a wafer transfer apparatus 100 and a delivery apparatus 101 are provided. The wafer transfer apparatus 100 has a transfer arm that is movable, for example, in the Y-direction, the θ-direction, and the vertical direction. The wafer transfer apparatus 100 can transfer the wafer W to/from each of the delivery apparatuses in the fourth block G4, the delivery apparatus 101 and the exposure apparatus 4 while supporting the wafer W by the transfer arm.

Figure 4:
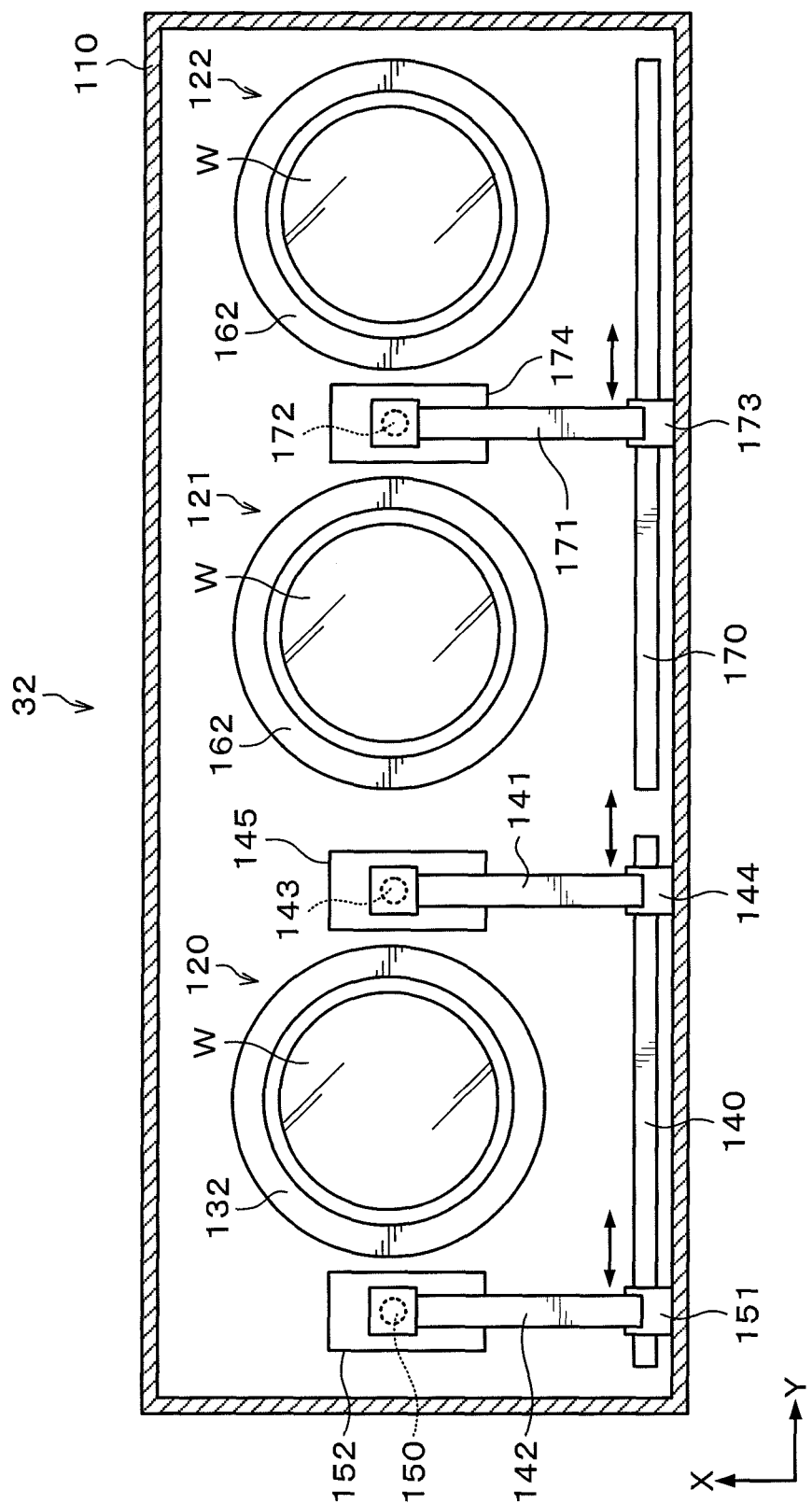
FIG. 4 is a transverse sectional view illustrating the outline of a configuration of a coating treatment apparatus.

Next, the configuration of the above-described coating treatment apparatus 32 will be described. The coating treatment apparatus 32 has a treatment container 110 which can hermetically close the inside as illustrated in FIG. 4. Transfer-in/out ports (not illustrated) for the wafer W are formed, for example, at three positions in a side surface on the wafer transfer region D side of the treatment container 110, and opening/closing shutters (not illustrated) are provided at the transferrin/out ports. The three transfer-in/out ports are formed at positions corresponding to later-described metal-containing film forming unit 120 and resist film forming units 121, 122.

Inside the treatment container 110, for example, the metal-containing film forming unit 120 which forms a metal-containing film on the wafer W and the resist film forming units 121, 122 each of which forms a resist film on the wafer W are provided. The metal-containing film forming unit 120 and the resist film forming units 121, 122 are arranged side by side in this order from a Y-direction negative direction (a left direction in FIG. 4) side to a Y-direction positive direction (a right direction in FIG. 4) side.

Figure 5:
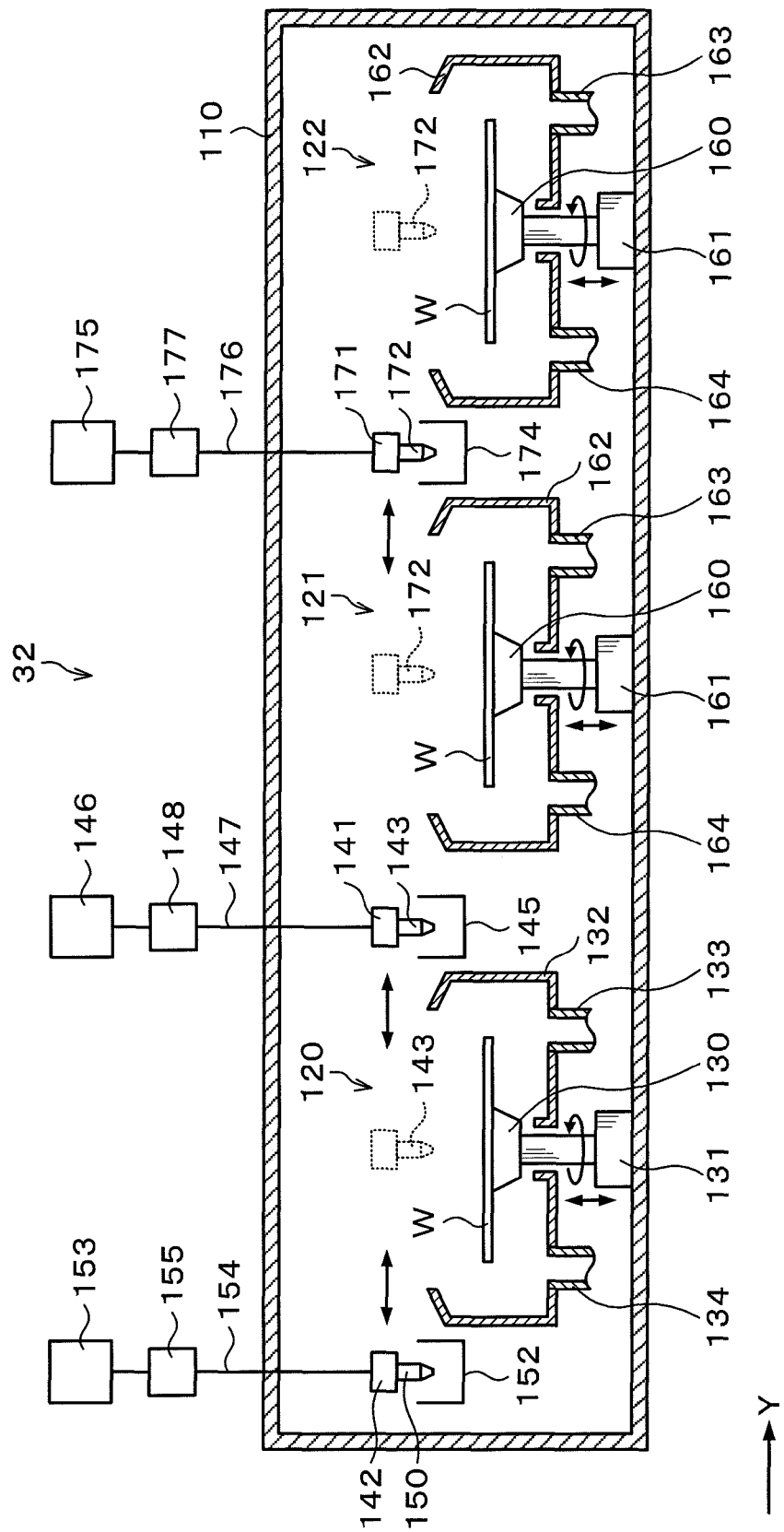
FIG. 5 is a longitudinal sectional view illustrating the outline of the configuration of the coating treatment apparatus.

At the metal-containing film forming unit 120, a spin chuck 130 is provided which holds and rotates the wafer W thereon as illustrated in FIG. 5. The spin chuck 130 has a horizontal upper surface and, for example, a suction port (not illustrated) sucking the wafer W is provided in the upper surface. By suction through the suction port, the wafer W can be suction-held on the spin chuck 130.

Below the spin chuck 130, a chuck drive part 131 equipped with, for example, a motor is provided. The spin chuck 130 can rotate at a predetermined speed by means of the chuck drive part 131. Further, the chuck drive part 131 is provided with a raising and lowering drive source such as, for example, a cylinder so that the spin chuck 130 can freely rise and lower.

Around the spin chuck 130, a cup 132 is provided which receives and collects liquid splashing or dropping from the wafer W. A drain pipe 133 that drains the collected liquid and an exhaust pipe 134 that exhausts the atmosphere in the cup 132 are connected to the lower surface of the cup 132.

As illustrated in FIG. 4, on an X-direction negative direction (a lower direction in FIG. 4) side of the cup 132, a rail 140 extending along a Y-direction (a right-left direction in FIG. 4) is formed. The rail 140 is formed, for example, from a Y-direction negative direction (a left direction in FIG. 4) side outer position of the cup 132 to a Y-direction positive direction (a right direction in FIG. 4) side outer position. To the rail 140, for example, two arms 141, 142 are attached.

On the first arm 141, an organic solution nozzle 143 as an organic solution supply part is supported which supplies an organic solution to the wafer W as illustrated in FIG. 4 and FIG. 5. The first arm 141 is movable on the rail 140 by means of a nozzle drive part 144 illustrated in FIG. 4. Thus, the organic solution nozzle 143 can move from a waiting section 145 provided at the Y-direction positive direction side outer position of the cup 132 to a position above a central portion of the wafer W in the cup 132, and further move in the diameter direction of the wafer W above the wafer W. Further, the first arm 141 can freely rise and lower by means of the nozzle drive part 144 to be able to adjust the height of the organic solution nozzle 143. Note that at the metal-containing film forming unit 120, it is possible to form an organic film by supplying the organic solution onto the wafer W as described above, and the metal-containing film forming unit 120 can function also as an organic film forming unit in the present invention.

To the organic solution nozzle 143, a supply pipe 147 communicating with an organic solution supply source 146 is connected as illustrated in FIG. 5. In the organic solution supply source 146, an organic solution is stored. The supply pipe 147 is provided with a supply equipment group 148 including a valve, a flow regulator and so on for controlling the flow of the organic solution. Note that the kind of the organic solution is not particularly limited, but various organic solutions can be used.

On the second arm 142, a metal-containing solution nozzle 150 as a metal-containing agent supply part is supported which supplies a metal-containing solution in a liquid form as a metal-containing agent onto the wafer W as illustrated in FIG. 4 and FIG. 5. The second arm 142 is movable on the rail 140 by means of a nozzle drive part 151 illustrated in FIG. 4. Thus, the metal-containing solution nozzle 150 can move from a waiting section 152 provided at a Y-direction negative direction side outer position of the cup 132 to a position above a central portion of the wafer W in the cup 132, and further move in the diameter direction of the wafer W above the wafer W. Further, the second arm 142 can freely rise and lower by means of the nozzle drive part 151 to be able to adjust the height of the metal-containing solution nozzle 150.

To the metal-containing solution nozzle 150, a supply pipe 154 communicating with a metal-containing solution supply source 153 is connected as illustrated in FIG. 5. The supply pipe 154 is provided with a supply equipment group 155 including a valve, a flow regulator and so on for controlling the flow of the metal-containing solution.

In the metal-containing solution supply source 153, a metal-containing solution made by dissolving metal in alcohol as a treatment agent is stored. As the alcohol, for example, IPA (isopropyl alcohol), ethanol, butanol, MIBC (methyl isobutyl carbinol) or the like is used. Further, as the metal, metal alkoxide (including chelate) for bonding with OH groups in the organic film as described later and, for example, Zr (zirconium), Ti (titanium), W (tungsten) or the like is used. Note that this metal is a nanoparticle having a small diameter, for example, a diameter of 5 nm or less.

At the resist film forming unit 121, a spin chuck 160 is provided which holds and rotates the wafer W thereon as illustrated in FIG. 5. The spin chuck 160 has a horizontal upper surface and, for example, a suction port (not illustrated) sucking the wafer W is provided in the upper surface. By suction through the suction port, the wafer W can be suction-held on the spin chuck 160.

Below the spin chuck 160, a chuck drive part 161 equipped with, for example, a motor is provided. The spin chuck 160 can rotate at a predetermined speed by means of the chuck drive part 161. Further, the chuck drive part 161 is provided with a raising and lowering drive source such as, for example, a cylinder so that the spin chuck 160 can freely rise and lower.

Around the spin chuck 160, a cup 162 is provided which receives and collects liquid splashing or dropping from the wafer W. A drain pipe 163 that drains the collected liquid and an exhaust pipe 164 that exhausts the atmosphere in the cup 162 are connected to the lower surface of the cup 162.

Note that also at the resist film forming unit 122, a spin chuck 160, a chuck drive part 161, a cup 162, a drain pipe 163, and an exhaust pipe 164 are provided as with the above-described resist film forming unit 121.

As illustrated in FIG. 4, on an X-direction negative direction (a lower direction in FIG. 4) side of the cups 162 of the resist film forming units 121, 122, a rail 170 extending along the Y-direction (the right-left direction in FIG. 4) is formed. The rail 170 is formed, for example, from a Y-direction negative direction (a left direction in FIG. 4) side outer position of the cup 162 of the resist film forming unit 121 to a Y-direction positive direction (a right direction in FIG. 4) side outer position of the cup 162 of the resist film forming unit 122. To the rail 170, for example, an arm 171 is attached.

On the arm 171, a resist solution nozzle 172 is supported which supplies a resist solution to the wafer W as illustrated in FIG. 4 and FIG. 5. The atm 171 is movable on the rail 170 by means of a nozzle drive part 173 illustrated in FIG. 4. Thus, the resist solution nozzle 172 can move from a waiting section 174 provided between the cup 162 of the resist film forming unit 121 and the cup 162 of the resist film forming unit 122 to a position above a central portion of the wafer W in the cup 162, and further move in the diameter direction of the wafer W above the wafer W. Further, the arm 171 can freely rise and lower by means of the nozzle drive part 173 to be able to adjust the height of the resist solution nozzle 172.

To the resist solution nozzle 172, a supply pipe 176 communicating with a resist solution supply source 175 is connected as illustrated in FIG. 5. In the resist solution supply source 175, a resist solution is stored. The supply pipe 176 is provided with a supply equipment group 177 including a valve, a flow regulator and so on for controlling the flow of the resist solution.

In the above coating and developing treatment system 1, a control unit 200 is provided as illustrated in FIG. 1. The control unit 200 is, for example, a computer and has a program storage part (not illustrated). In the program storage part, a program is stored which executes the wafer treatment in the coating and developing treatment system 1. Note that the program may be the one which is stored, for example, in a computer-readable storage medium H such as a computer-readable hard disk (HD), flexible disk (FD), compact disk (CD), magneto-optical disk (MO), or memory card, and installed from the storage medium H into the control unit 200.

Next, the treatment method of the wafer W performed using the coating and developing treatment system 1 configured as described above will be described. Note that a predetermined pattern of a $SiO_2$ film or the like has been formed beforehand on the wafer W to be treated in the coating and developing treatment system 1 in this embodiment.

First, a cassette C housing a plurality of wafers W therein is mounted on a predetermined cassette mounting plate 11 in the cassette station 2. Then, the wafers W in the cassette C are sequentially taken out by the wafer transfer apparatus 21 and transferred, for example, to the delivery apparatus 53 in the third block G3 in the treatment station 3.

Then, the wafer W is transferred by the wafer transfer apparatus 70 to the thermal treatment apparatus 40 in the second block G2 and temperature-regulated. Thereafter, the wafer W is transferred by the wafer transfer apparatus 70, for example, to the lower anti-reflection film forming, apparatus 31 in the first block G1, in which a lower anti-reflection film is formed on the wafer W. The wafer W is then transferred to the thermal treatment apparatus 40 in the second block G2 and heated and temperature-regulated. The wafer W is then returned back to the delivery apparatus 53 in the third block G3.

Then, the wafer W is transferred by the wafer transfer apparatus 90 to the delivery apparatus 54 in the same third block G3. Thereafter, the wafer W is transferred by the wafer transfer apparatus 70 to the adhesion apparatus 41 in the second block G2 and subjected to an adhesion treatment. The wafer W is then transferred by the wafer transfer apparatus 70 to the thermal treatment apparatus 40 and temperature-regulated. The wafer W is then transferred by the wafer transfer apparatus 70 to the metal-containing film forming unit 120 in the coating treatment apparatus 32.

Figure 6A:
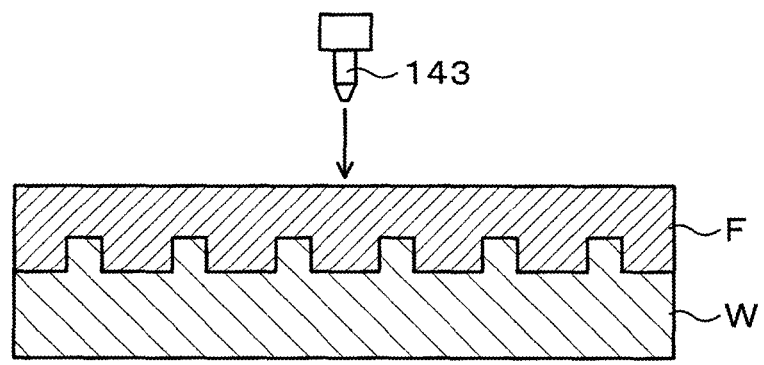
FIG. 6A is an explanatory view of a film forming treatment illustrating an appearance in which an organic film is formed on the wafer.

The wafer W transferred to the metal-containing film forming unit 120 is suction-held by the spin chuck 130. Subsequently, the organic solution nozzle 143 at the waiting section 145 is moved by the first arm 141 to the position above the central portion of the wafer W. Thereafter, while the wafer W is being rotated by the spin chuck 130, the organic solution is supplied from the organic solution nozzle 143 to the central portion of the wafer W. The organic solution supplied on the wafer W is diffused over the entire front surface of the wafer W by the centrifugal force generated by the rotation of the wafer W. In this event, the fluidity of the organic solution is excellent, so that even if a predetermined pattern is formed on the wafer W, the organic solution appropriately enters grooves of the pattern and is embedded therein. In this manner, the organic solution is applied on the wafer W to form an organic film F on the wafer W as illustrated in FIG. 6A. Note that, on the wafer W, the predetermined pattern and the lower anti-reflection film are formed under the organic film F but are omitted in the illustrated example.

Thereafter, the organic solution nozzle 143 is moved by the first arm 141 from the position above the central portion of the wafer V to the waiting section 145, and the metal-containing solution nozzle 150 at the waiting section 152 is moved by the second arm 142 to the position above the central portion of the wafer W.

Subsequently, while the wafer W is being rotated by the spin chuck. 130, the metal-containing solution is supplied from the metal-containing solution nozzle 150 to the central portion of the wafer W. The metal-containing solution supplied on the wafer W is diffused over the entire front surface of the organic film F of the wafer W by the centrifugal force generated by the rotation of the wafer W. Note that in this event, the organic film F has not been dried or hardened, namely, a solvent component remains in the organic film F.

Figure 6B:
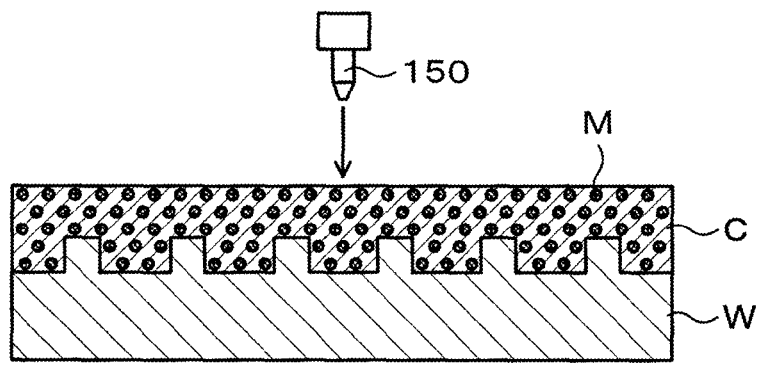
FIG. 6B is an explanatory view of the film forming treatment illustrating an appearance in which a metal-containing film is formed on the wafer.

Once the metal-containing solution is applied on the organic film F as described above, alcohol in the metal-containing solution mixes with the solvent in the organic film F and enters the organic film F. More specifically, the solvent mixed with alcohol is discharged from the organic film F, and alcohol enters pores formed in the organic film F. Along with the entrance of alcohol into the organic film F, metal also enters the organic film F using the alcohol as an entrance route. Then, the metal bonds with OH groups (hydroxyl groups) in the organic film F, and metal M infiltrates the organic film F as illustrated in FIG. 6B. Thus, a metal-containing film C containing the metal M is formed on the wafer W. Note that the metal-containing film C functions as a metal hard mask film in etching treatment.

Then, the wafer W is transferred by the wafer transfer apparatus 70 to the thermal treatment apparatus 40 in the second block G2, and heated and temperature-regulated. Thereafter, the wafer W is transferred by the wafer transfer apparatus 70 to the resist film forming unit 121 in the coating treatment apparatus 32.

The wafer W transferred to the resist film forming unit 121 is suction-held by the spin chuck 160. Subsequently, the resist solution nozzle 172 at the waiting section 174 is moved by the arm 171 to the position above the central portion of the wafer W. Thereafter, while the wafer W is being rotated by the spin chuck 160, the resist solution is supplied from the resist solution nozzle 172 to the central portion of the wafer W. The resist solution supplied on the wafer W is diffused over the entire front surface of the wafer W by the centrifugal force generated by the rotation of the wafer W. In this manner, the resist solution is applied on the metal-containing film C of the wafer W to form a resist film on the wafer W.

The wafer W is then transferred by the wafer transfer apparatus 70 to the thermal treatment apparatus 40 and subjected to pre-baking. The wafer W is then transferred by the wafer transfer apparatus 70 to the delivery apparatus 55 in the third block G3.

Then, the wafer W is transferred by the wafer transfer apparatus 70 to the upper anti-reflection film forming apparatus 33, in which an upper anti-reflection film is formed on the wafer W. The wafer W is then transferred by the wafer transfer apparatus 70 to the thermal treatment apparatus 40, and heated and temperature-regulated. The wafer W is then transferred by the wafer transfer apparatus 70 to the edge exposure apparatus 42, in which edge exposure processing is performed on the edge portion of the resist film on the wafer W.

The wafer W is then transferred by the wafer transfer apparatus 70 to the delivery apparatus 56 in the third block G3. The wafer W is then transferred by the wafer transfer apparatus 90 to the delivery apparatus 52 and transferred by the shuttle transfer apparatus 80 to the delivery apparatus 62 in the fourth block G4.

The wafer W is then transferred by the wafer transfer apparatus 100 in the interface station 5 to the exposure apparatus 4 and subjected to exposure processing.

The wafer W is then transferred by the wafer transfer apparatus 100 from the exposure apparatus 4 to the delivery apparatus 60 in the fourth block G4. The wafer W is then transferred by the wafer transfer apparatus 70 to the thermal treatment apparatus 40 in the second block G2 and subjected to post-exposure baking. The wafer W is then transferred by the wafer transfer apparatus 70 to the developing treatment apparatus 30 in the first block G1 and developed. After the development is finished, the wafer W is transferred by the wafer transfer apparatus 70 to the thermal treatment apparatus 40 in the second block G2 and subjected to post-baking treatment.

Thereafter, the wafer W is transferred by the wafer transfer apparatus 70 to the delivery apparatus 50 in the third block G3, and then transferred by the wafer transfer apparatus 21 in the cassette station 2 to the cassette C on the predetermined cassette mounting plate 11. Thus, a series of photolithography processing ends.

According to the above embodiment, when forming the organic film F on the wafer W using the spin coating method, it is possible, even if the predetermined pattern has been formed on the wafer W, to cause the organic solution to appropriately enter the grooves of the pattern because the organic solution to be supplied to the wafer W is excellent in fluidity and embedding property. Therefore, it is possible to appropriately form the organic film F on the wafer W. Further, when the metal-containing solution is supplied onto the organic film F thereafter, alcohol in the metal-containing solution enters the organic film F to cause the metal M to enter the organic film F using the alcohol as an entrance route. Thus, a metal-containing film C in which metal M infiltrates the organic film F is formed on the wafer W. The metal-containing film C contains the metal M and therefore has a high etching selection ratio that is performance originally required in the etching treatment after the photolithography processing. As described above, according to this embodiment, the metal-containing film C having a high etching selection ratio can be appropriately formed on the wafer W.

Though the metal-containing solution made by dissolving the metal M in alcohol is supplied onto the wafer W when forming the metal-containing film C on the organic film F in the above embodiment, these alcohol and metal M may be separately supplied onto the wafer W.

Figure 7:
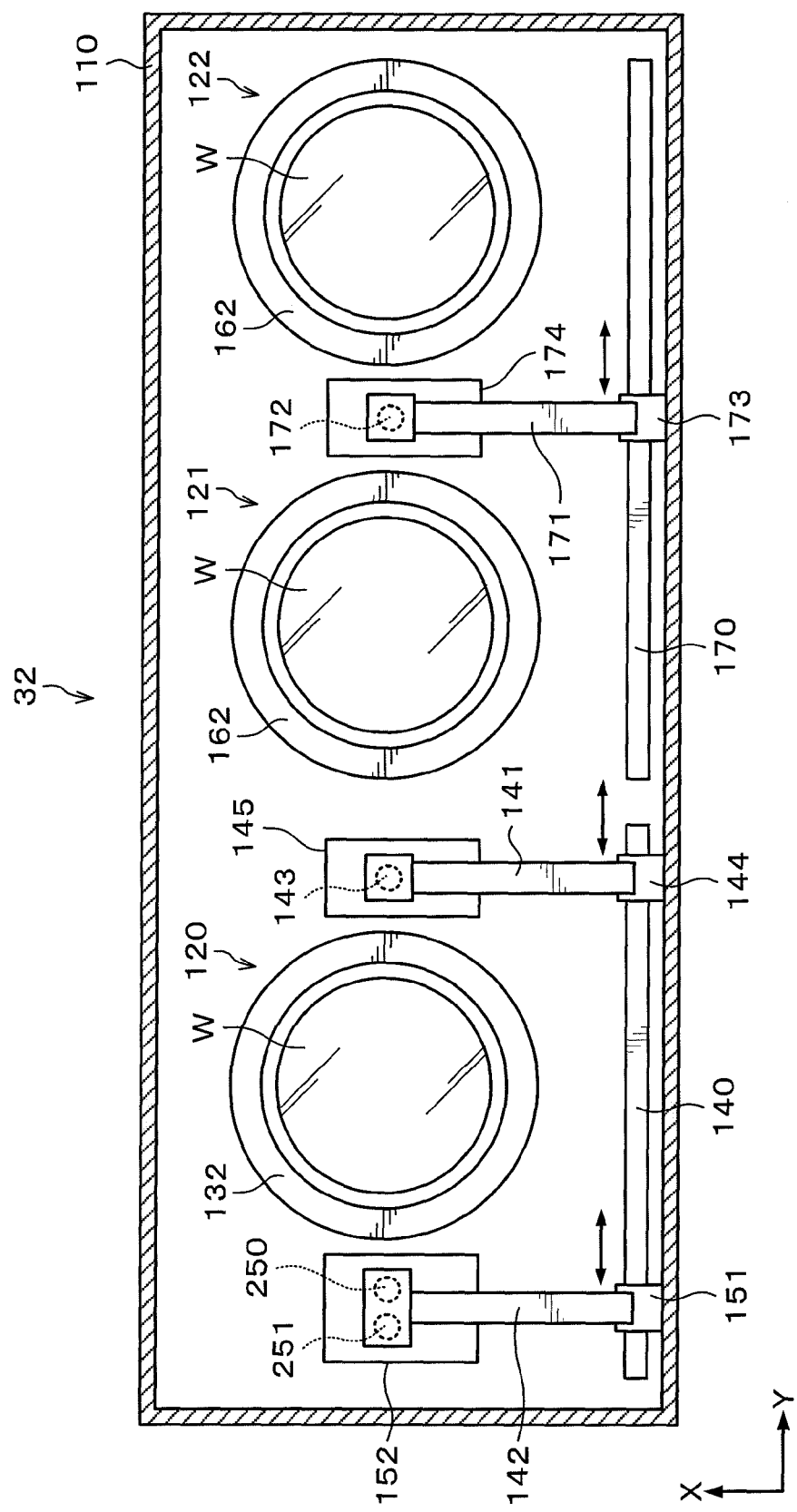
FIG. 7 is a transverse sectional view illustrating the outline of a configuration of a coating treatment apparatus according to another embodiment.
Figure 8:
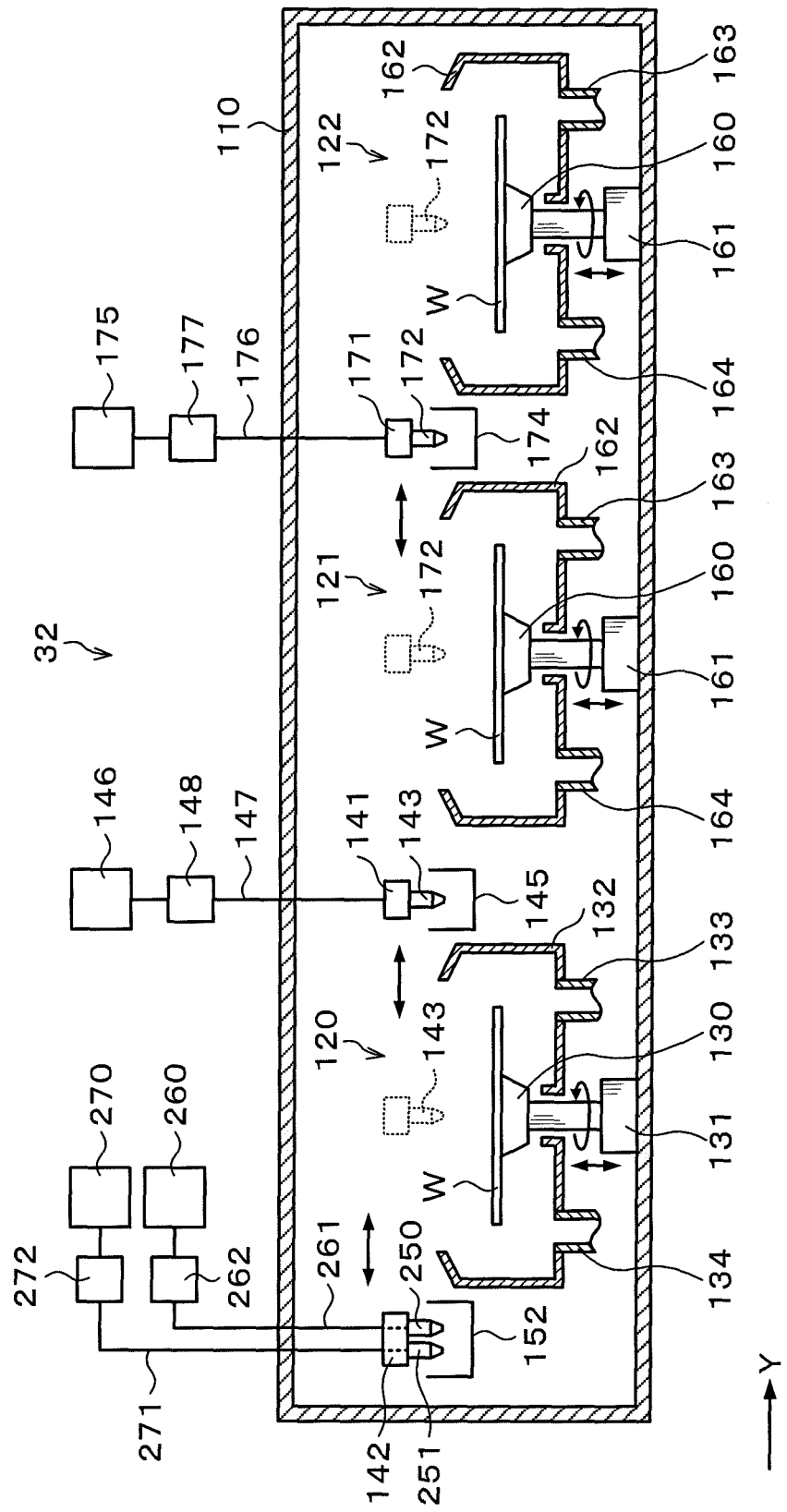
FIG. 8 is a longitudinal sectional view illustrating the outline of the configuration of the coating treatment apparatus according to another embodiment.

As illustrated in FIG. 7 and FIG. 8, an alcohol nozzle 250 as a treatment agent supply part that supplies alcohol in a liquid form as a treatment agent onto the wafer W and a metal-containing solution nozzle 251 as a metal-containing agent supply part that supplies a metal-containing solution in a liquid form as a metal-containing agent containing the metal M onto the wafer W are supported on the second arm 142 of the metal-containing film forming unit 120.

To the alcohol nozzle 250, a supply pipe 261 communicating with an alcohol supply source 260 is connected as illustrated in FIG. 8. The supply pipe 261 is provided with a supply equipment group 262 including a valve, a flow regulator and so on for controlling the flow of the alcohol. Note that as the alcohol, the same alcohol as in the above embodiment is used.

To the metal-containing solution nozzle 251, a supply pipe 271 communicating with a metal-containing solution supply source 270 is connected. The supply pipe 271 is provided with a supply equipment group 272 including a valve, a flow regulator and so on for controlling the flow of the metal-containing solution. Note that as metal M in the metal-containing solution, the same metal as in the above embodiment is used, but various solvents can be used as the solvent therefor. As the solvent, various materials such as pure water can be used as long as the material dissolves the metal M and never dissolves the organic film F.

The other configuration of the metal-containing film forming unit 120 is the same as that of the metal-containing film forming unit 120 in the above embodiment, and therefore description thereof is omitted. Note that the alcohol nozzle 250 and the metal-containing solution nozzle 251 are supported on the same arm 142 in the above configuration, but may be independently supported on separate arms.

Figure 9A:
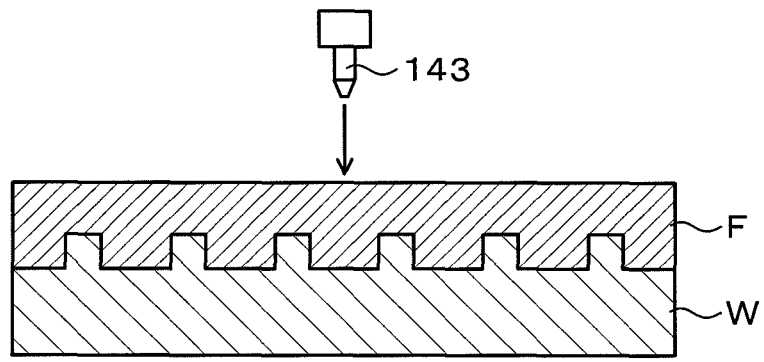
FIG. 9A, FIG. 9B, FIG. 9C are explanatory views of a film forming treatment according to another embodiment, FIG. 9A illustrating an appearance in which an organic film is formed on the wafer, FIG. 9B illustrating an appearance in which alcohol enters the organic film, and FIG. 9C illustrating an appearance in which a metal-containing film is formed on the wafer.

In this case, at the metal-containing film forming unit 120, after the wafer W is suction-held by the spin chuck 130, the organic solution nozzle 143 at the waiting section 145 is moved by the first arm 141 to the position above the central portion of the wafer W. Thereafter, while the wafer W is being rotated by the spin chuck 130, the organic solution is supplied from the organic solution nozzle 143 to the central portion of the wafer W. The organic solution supplied on the wafer W is diffused over the entire front surface of the wafer W by the centrifugal force generated by the rotation of the wafer W. In this manner, the organic solution is applied on the wafer W to form an organic film F on the wafer W as illustrated in FIG. 9A.

Thereafter, the organic solution nozzle 143 is moved by the first arm 141 from the position above the central portion of the wafer W to the waiting section 145, and the alcohol nozzle 250 at the waiting section 152 is moved by the second arm to the position above the central portion of the wafer W. Subsequently, while the wafer W is being rotated by the spin chuck 130, alcohol is supplied from the alcohol nozzle 250 to the central portion of the wafer W. The alcohol supplied on the wafer W is diffused over the entire front surface of the organic film F of the wafer W by the centrifugal force generated by the rotation of the wafer W. Note that, in this event, the organic film F has not been dried or hardened, namely, a solvent component remains in the organic film F.

Figure 9B:
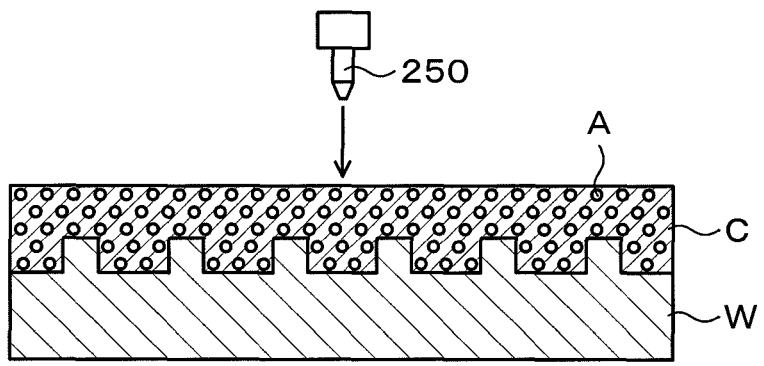

Once the alcohol is applied on the organic film F as described above, the alcohol mixes with the solvent in the organic film F and enters the organic film F as illustrated in FIG. 9B. More specifically, the solvent mixed with alcohol A is discharged from the organic film F, and alcohol A enters pores formed in the organic film F.

Thereafter, the metal-containing solution nozzle 251 is moved by the second arm 142 to the position above the central portion of the wafer W. Subsequently, while the wafer W is being rotated by the spin chuck 130, the metal-containing solution is supplied from the metal-containing solution nozzle 251 to the central portion of the wafer W. The metal-containing solution supplied on the wafer W is diffused over the entire front surface of the organic film F of the wafer W by the centrifugal force generated by the rotation of the wafer W.

Figure 9C:
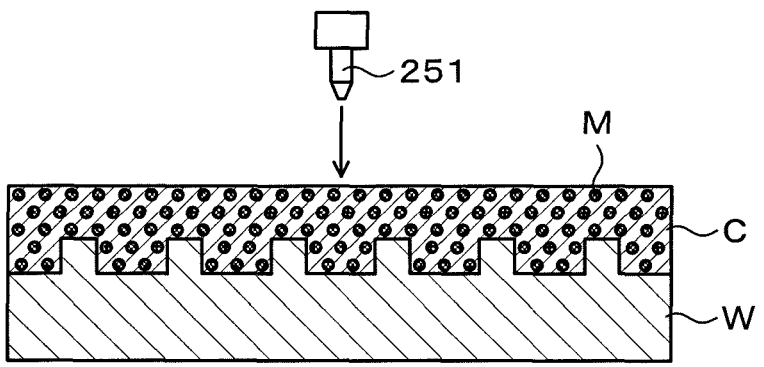

Once the metal-containing solution is applied onto the organic film F as described above, the metal-containing solution enters the organic film F using the alcohol A in the organic film F as an entrance route. Then, the metal M in the metal-containing solution bonds with OH groups (hydroxyl groups) in the organic film F, and the metal M infiltrates the organic film F as illustrated in FIG. 9C. Thus, a metal-containing film C containing the metal M is formed on the wafer W.

Also in this embodiment, the same effect as that in the above embodiment can be provided. Namely, the metal-containing film C having a high etching selection ratio can be appropriately formed on the wafer W.

At the time when forming the metal-containing film C on the wafer W, the metal-containing solution made by dissolving the metal M in the alcohol A may be supplied onto the wafer W or the alcohol A and the metal M may be separately supplied onto the wafer W as described above, and in any of the cases the same effect can be provided. However, it is more preferable to supply the metal-containing solution made by dissolving the metal M in the alcohol A onto the wafer W as in the former case in terms of the throughput.

In the above embodiment, the amount of the solvent in the organic film F may be adjusted after the organic film F is formed on the wafer W. The adjustment of the amount of the solvent before forming the metal-containing film C makes it possible to adjust the amount of the alcohol A entering the organic film F and further adjust the amount of the metal M infiltrating the organic film F.

For example, in the case of decreasing the amount of the solvent in the organic film F, thermal treatment is performed on the organic film F to evaporate the solvent therein. In this case, as a solvent adjusting part that adjusts the amount of the solvent, the above-described thermal treatment apparatuses 40 is used.

Figure 10:
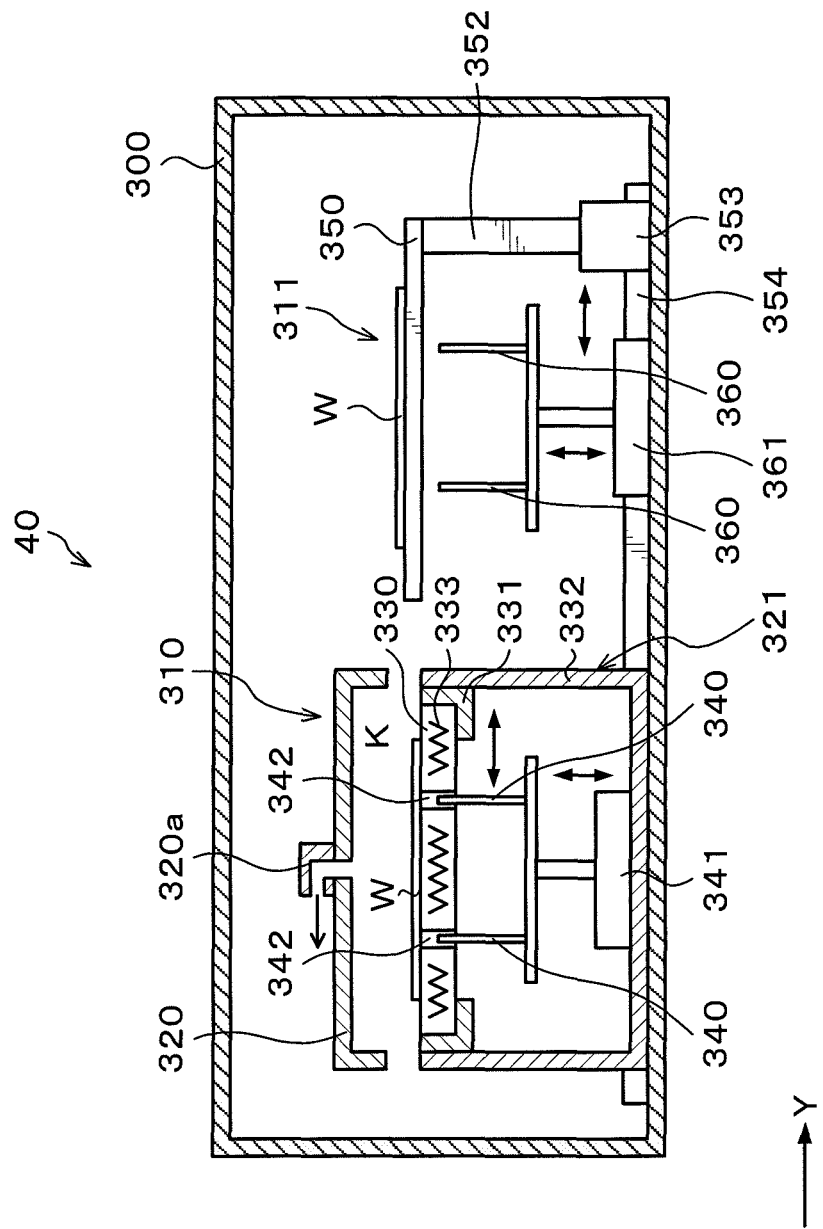
FIG. 10 is a longitudinal sectional view illustrating the outline of a configuration of a thermal treatment apparatus.
Figure 11:
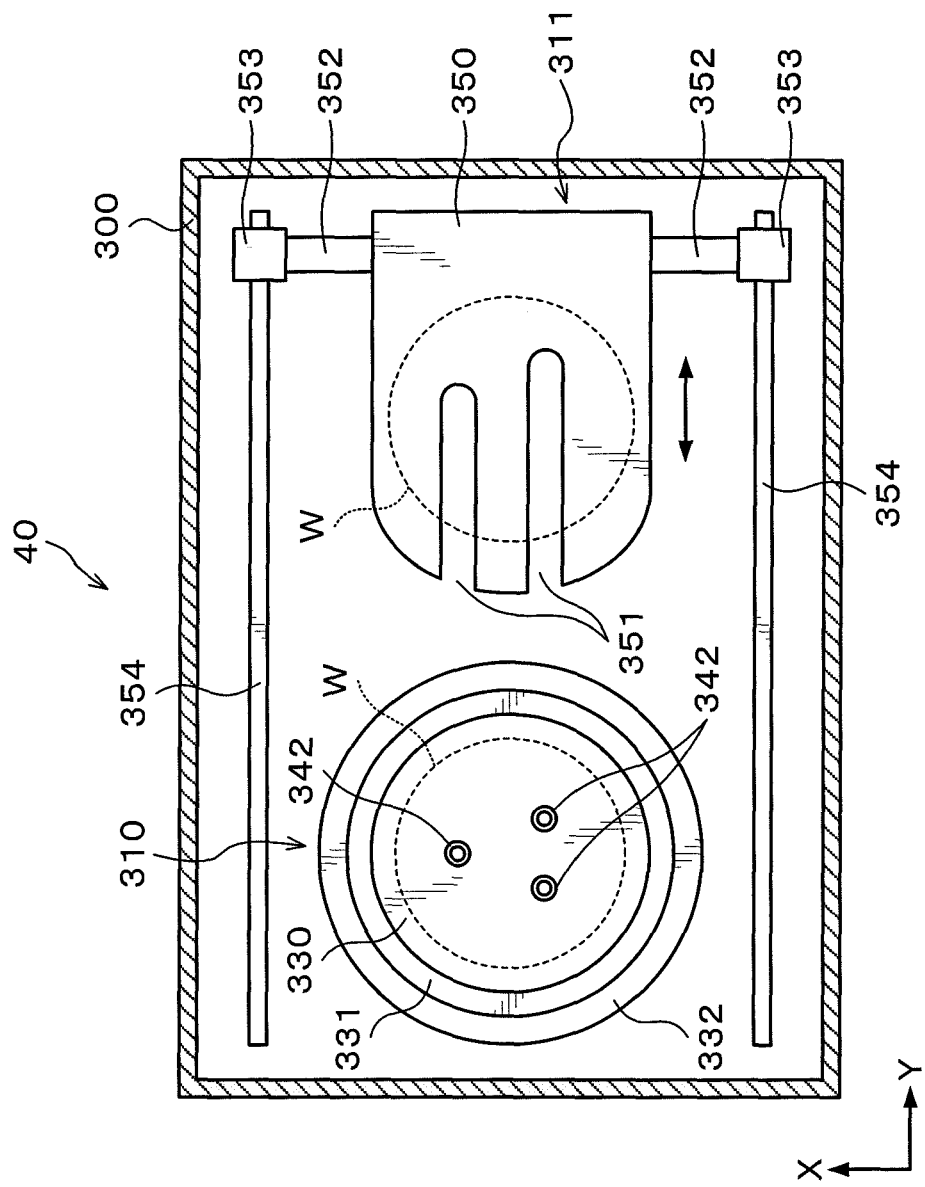
FIG. 11 is a transverse sectional view illustrating the outline of the configuration of the thermal treatment apparatus.

The thermal treatment apparatus 40 has a treatment container 300 which can hermetically close the inside as illustrated in FIG. 10 and FIG. 11. A transfer-in/out port (not illustrated) for the wafer W is formed, for example, in a side surface on the wafer transfer region D side of the treatment container 300, and an opening/closing shutter (not illustrated) is provided at the transfer-in/out port.

Inside the treatment container 300, a heating unit 310 that performs heat treatment on the wafer W and a cooling unit 311 that performs cooling treatment on the wafer W are provided. The heating unit 310 and the cooling unit 311 are provided side by side in the Y-direction, and the cooling unit 311 is disposed on the wafer transfer region D side.

The heating unit 310 includes a lid body 320 that is located on the upper side as illustrated in FIG. 10 and vertically movable and a thermal plate housing part 321 that is located on the lower side and united with the lid body 320 to form a treatment chamber K.

The lid body 320 has an almost cylindrical shape with its lower surface open. At the middle portion of the upper surface of the lid body 320, an exhaust part 320a is provided. The atmosphere inside the treatment chamber K is uniformly exhausted through the exhaust part 320a.

The thermal plate housing part 321 includes an annular holding member 331 that houses a thermal plate 330 and holds the outer peripheral portion of the thermal plate 330, and a support ring 332 in an almost cylindrical shape surrounding the outer periphery of the holding member 331. The thermal plate 330 has an almost thick disk shape and can mount and heat the wafer W thereon. Further, in the thermal plate 330, a heater 333 that generates heat, for example, by power feeding is embedded. The heating temperature of the thermal plate 330 is controlled, for example, by the control unit 200 so that the wafer W mounted on the thermal plate 330 is heated to a predetermined temperature.

Below the thermal plate 330, for example, three raising and lowering pins 340 are provided for supporting the wafer W from below and raising and lowering the wafer W. The raising and lowering pins 340 can move up and down by means of a raising and lowering drive part 341. Near the middle portion of the thermal plate 330, through holes 342 penetrating the thermal plate 330 in the thickness direction are formed, for example, at three positions. The raising and lowering pins 340 are inserted into the through holes 342 to be able to project from the upper surface of the thermal plate 330.

The cooling unit 311 has a cooling plate 350. The cooling plate 350 has an almost square flat plate shape as illustrated in FIG. 11 and has an end face on the thermal plate 330 side curved in an arc shape. In the cooling plate 350, two slits 351 are formed along the Y-direction. The slits 351 are formed from the end face on the thermal plate 330 side of the cooling plate 350 to the vicinity of the middle portion of the cooling plate 350. The slits 351 can prevent the cooling plate 350 from interfering with the raising and lowering pins 340 of the heating unit 310 and later-described raising and lowering pins 360 of the cooling unit 311. Further, in the cooling plate 350, a cooling member (not illustrated) such as a cooling water or a Peltier element is embedded. The cooling temperature of the cooling plate 350 is controlled, for example, by the control unit 200 so that the wafer W mounted on the cooling plate 350 is cooled to a predetermined temperature.

The cooling plate 350 is supported on a supporting arm 352 as illustrated in FIG. 10. To the supporting arm 352, a drive part 353 is attached. The drive part 353 is attached on a rail 354 extending in the Y-direction. The rail 354 extends from the cooling unit 311 to the heating unit 310. By means of the drive part 353, the cooling plate 350 can move along the rail 354 between the heating unit 310 and the cooling unit 311.

Below the cooling plate 350, for example, three raising and lowering pins 360 for supporting the wafer W from below and raising and lowering it are provided. The raising and lowering pins 360 can move up and down by means of a raising and lowering drive part 361. Then, the raising and lowering pins 360 pass through the slits 351 to be able to project from the upper surface of the cooling plate 350.

In this case, the wafer W on which the organic film F has been formed at the metal-containing film forming unit 120 is transferred by the wafer transfer apparatus 70 to the thermal treatment apparatus 40. In this event, the organic film F has not been dried or hardened, namely, a solvent component remains in the organic film F.

After the wafer W is transferred into the thermal treatment apparatus 40, the wafer W is delivered from the wafer transfer apparatus 70 to the raising and lowering pins 360 which have been raised and waiting in advance. Subsequently, the raising and lowering pins 360 are lowered to mount the wafer W on the cooling plate 350.

Thereafter, the cooling plate 350 is moved along the rail 354 by the drive part 353 to above the thermal plate 330, and the wafer W is delivered to the raising and lowering pins 340 which have been raised and waiting and waiting in advance. Then, after the lid body 320 is closed, the raising and lowering pins 340 are lowered to mount the wafer W on the thermal plate 330. Then, the wafer W on the thermal plate 330 is heated to a predetermined temperature, for example, 23° C. to 80° C. The heating performed by the thermal plate 330 heats the wafer W to evaporate the solvent in the organic film F. The amount of evaporation of the solvent is controlled by the heating temperature and the heating time by the thermal plate 330. Note that the heating treatment of the wafer W may be performed in a reduced atmosphere or in a solvent atmosphere.

Then, after the lid body 320 is opened, the raising and lowering pins 340 are raised and the cooling plate 350 is moved to above the thermal plate 330. Subsequently, the wafer W is delivered from the raising and lowering pins 340 to the cooling plate 350, and the cooling plate 350 is moved to the transfer-in/out port side. During the movement of the cooling plate 350, the wafer W is cooled to a predetermined temperature.

Figure 12:
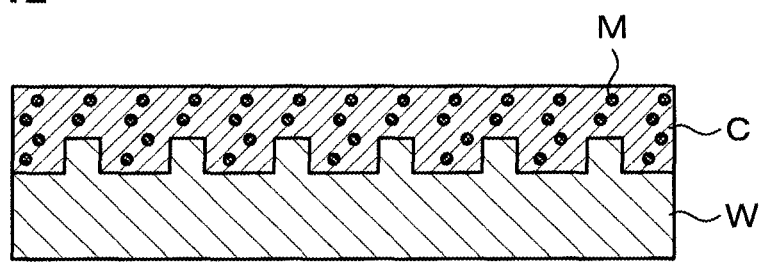
FIG. 12 is an explanatory view illustrating an appearance in which a metal-containing film is formed on the wafer in another embodiment.

Then, the wafer W is transferred by the wafer transfer apparatus 70 again to the metal-containing film forming unit 120 in the coating treatment apparatus 32. At the metal-containing film forming unit 120, a metal-containing film C is formed on the wafer W. In this event, since the amount of the solvent in the organic film F has been decreased, the amount of the alcohol A entering the organic film F also decreases to decrease the amount of the metal M infiltrating the organic film F as illustrated in FIG. 12 (see, for example, FIG. 6B as comparison).

Figure 13:
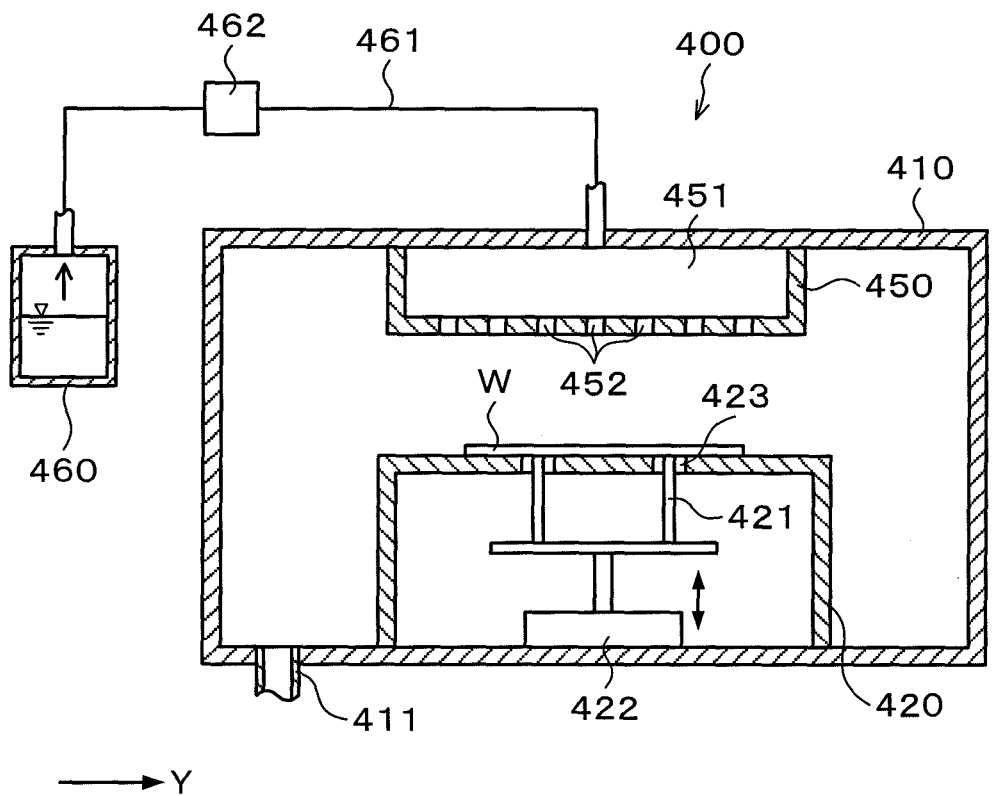
FIG. 13 is a longitudinal sectional view illustrating the outline of a configuration of a coating treatment apparatus according to another embodiment.

On the other hand, for example, when increasing the amount of the solvent in the organic film F, a solvent is supplied to the organic film F. In this case, as a solvent adjusting part that adjusts the amount of the solvent, a coating treatment apparatus 400 illustrated in FIG. 13 is used. The coating treatment apparatus 400 can be installed at any place in the coating and developing treatment system 1, and installed, for example, in the first block G1.

The coating treatment apparatus 400 has a treatment container 410 which can hermetically close the inside. A transfer-in/out port (not illustrated) for the wafer W is formed, for example, in a side surface on the wafer transfer region D side of the treatment container 410, and an opening/closing shutter (not illustrated) is provided at the transfer-in/out port. To the bottom surface of the treatment container 410, an exhaust pipe 411 that exhausts the atmosphere therein is connected.

At the bottom surface in the treatment container 410, for example, a mounting table 420 on which the wafer W is mounted is provided. In the mounting table 420, for example, three raising and lowering pins 421 are provided for supporting the wafer W from below and raising and lowering the wafer W. The raising and lowering pins 421 can move up and down by means of a raising and lowering drive part 422. In the upper surface of the mounting table 420, through holes 423 penetrating the upper surface in the thickness direction are formed, for example, at three positions. The raising and lowering pins 421 are inserted into the through holes 423.

On the ceiling surface in the treatment container 410 and above mounting table 420, a shower head 450 that supplies a solvent in a gas form downward onto the wafer W is provided. The shower head 450 is arranged to face the wafer W mounted on the mounting table 420. Inside the shower head 450, an inner space 451 is formed into which the solvent supplied from a later-described solvent supply source 460 is introduced. At the lower surface of the shower head 450, a plurality of supply ports 452 that supply downward the solvent introduced into the inner space 451 are provided, distributed over the entire lower surface of the shower head 450. In short, the plurality of supply ports 452 are formed so that the solvent in a gas form is supplied from the shower head 450 to the wafer W uniformly within the horizontal plane.

To the shower head 450, a supply pipe 461 communicating with a solvent supply source 460 is connected. In the solvent supply source 460, a solvent in a liquid form is stored, and the solvent in a liquid form is heated to evaporate so as to form into the solvent in a gas form. The supply pipe 461 is provided with a supply equipment group 462 including a valve, a flow regulator and so on for controlling the flow of the solvent.

In this case, the wafer W on which the organic film F has been formed at the metal-containing film forming unit 120 in the coating treatment apparatus 32 is transferred by the wafer transfer apparatus 70 to the coating treatment apparatus 400. In this event, the organic film F has not been dried or hardened, namely, a solvent component remains in the organic film F.

After the wafer W is transferred into the coating treatment apparatus 400, the wafer W is delivered to the raising and lowering pins 421 which have been raised and waiting in advance. Subsequently, the raising and lowering pins 421 are lowered to mount the wafer W on the mounting table 420. Thereafter, the solvent in a gas form is supplied from the shower head 450 onto the wafer W. Then, the solvent enters the organic film F on the wafer W to increase the amount of the solvent in the organic film F. The amount of the entering solvent is controlled by the supply flow rate and the supply time of the solvent from the shower head 450.

Figure 14:
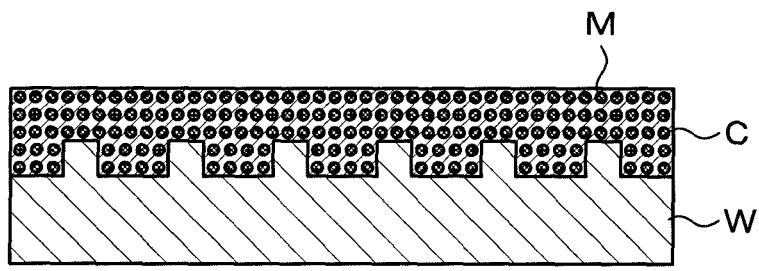
FIG. 14 is an explanatory view illustrating an appearance in which a metal containing film is formed on the wafer in another embodiment.

Thereafter, the wafer W is transferred by the wafer transfer apparatus 70 again to the metal-containing film forming unit 120 in the coating treatment apparatus 32. At the metal-containing film forming unit 120, a metal-containing film C is formed on the wafer W. In this event, since the amount of the solvent in the organic film F has been increased, the amount of the alcohol A entering the organic film F also increases to increase the amount of the metal M infiltrating the organic film F as illustrated in FIG. 14 (see, for example, FIG. 6B as comparison).

By decreasing or increasing the amount of the solvent in the organic film F for adjustment after forming the organic film F on the wafer W as described above, the amount of the metal M infiltrating the organic film F can be adjusted. In other words, the amount of the metal M in the organic film F can be adjusted according to the etching selection ratio required in the etching treatment. Accordingly, the etching treatment can be more appropriately performed.

Note that the apparatus that decreases the amount of the solvent in the organic film F is not limited to the configuration of the above thermal treatment apparatus 40 but may be any apparatus as long as it thermally treats the organic film F. Further, the apparatus that increases the amount of the solvent in the organic film F is not limited to the configuration of the above coating treatment apparatus 400 but may be any apparatus as long as it additionally supplies the solvent into the organic film F.

The metal-containing film forming unit 120 and the resist film forming units 121, 122 are provided in the same coating treatment apparatus 32 in the above embodiment but may be provided in separate apparatuses.

Further, the metal-containing solution supplied from the metal-containing solution nozzle 150 to the wafer W is in a liquid form in the above embodiment but may be in a gas form. In this case, for example, an apparatus similar to the above-described coating treatment apparatus 400 is used, and a metal-containing agent supply source is used in place of the solvent supply source 460. Inside the metal-containing agent supply source, a metal-containing solution made by dissolving the metal M in the alcohol A is stored in a liquid form, and the metal-containing solution is heated to evaporate to form into a metal-containing agent in a gas form. In the coating treatment apparatus 400, the metal-containing agent in a gas form is supplied from the shower head 450 to the wafer W mounted on the mounting table 420. Then, the metal M infiltrates the organic film F on the war W, whereby a metal-containing film C can be appropriately formed on the wafer W.

Similarly, each of the alcohol A supplied from the alcohol nozzle 250 and the metal-containing solution supplied from the metal-containing solution nozzle 251 to the wafer W is in a liquid form but may be in a gas form. Also in this case, an apparatus similar to the coating treatment apparatus 400 is used, and the alcohol A in a gas form and the metal-containing solution in a gas form are supplied onto the wafer W to appropriately form the metal-containing film C on the wafer W.

Figure 15:
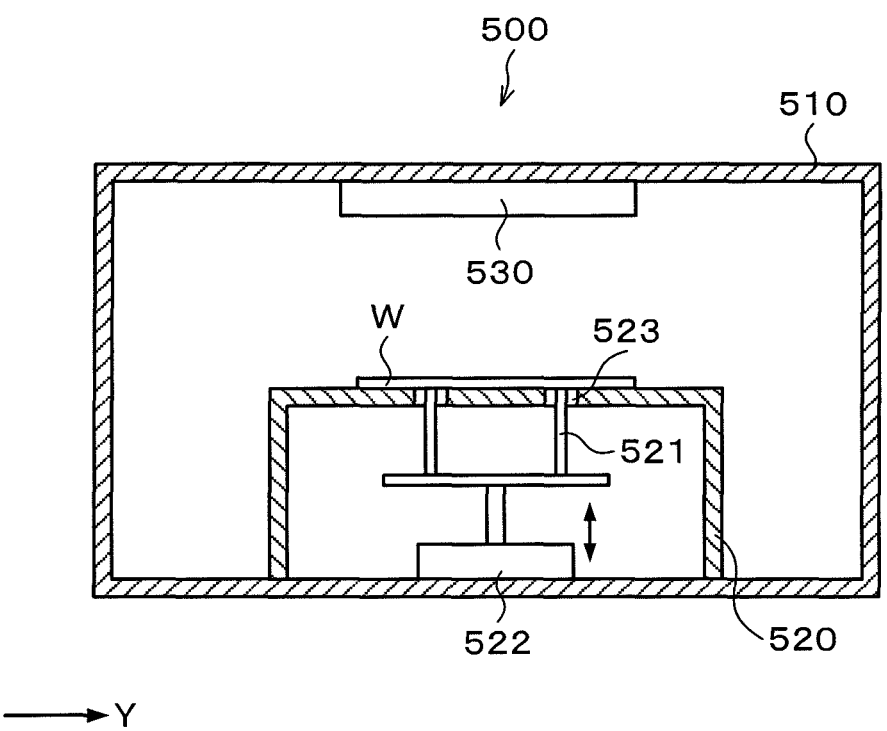
FIG. 15 is a longitudinal sectional view illustrating the outline of a configuration of a crosslink cutting apparatus.

Though the organic solution is applied onto the wafer W and then the metal M is caused to infiltrate the undried organic film F in the above embodiment, the metal M may be caused to infiltrate the organic film F after the organic film. F is thermally treated. In this case, to cut crosslink of the thermally treated organic film F, a crosslink cutting apparatus 500 illustrated in FIG. 15 is used. The crosslink cutting apparatus 500 can be installed at any place in the coating and developing treatment system 1, and installed, for example, in the second block G2.

The crosslink cutting apparatus 500 has a treatment container 510 which can hermetically close the inside. A transfer-in/out port (not illustrated) for the wafer W is formed, for example, in a side surface on the wafer transfer region D side of the treatment container 510, and an opening/closing shutter (not illustrated) is provided at the transfer-in/out port.

At the bottom surface in the treatment container 510, for example, a mounting table 520 on which the wafer W is mounted is provided. In the mounting table 520, three raising and lowering pins 521 are provided for supporting the wafer W from below and raising and lowering the wafer W. The raising and lowering pins 521 can move up and down by means of a raising and lowering drive part 522. In the upper surface of the mounting table 520, through holes 523 penetrating the upper surface in the thickness direction are formed, for example, at three positions. The raising and lowering pins 521 are inserted into the through holes 523.

On the ceiling surface in the treatment container 510 and above mounting table 520, an ultraviolet irradiation part 530 as a crosslink cutting part is provided which irradiates the entire surface of the wafer W on the mounting table 520 with ultraviolet light. For the ultraviolet irradiation part 530, for example, a deuterium lamp, an excimer lamp or the like is used.

Figure 16A:
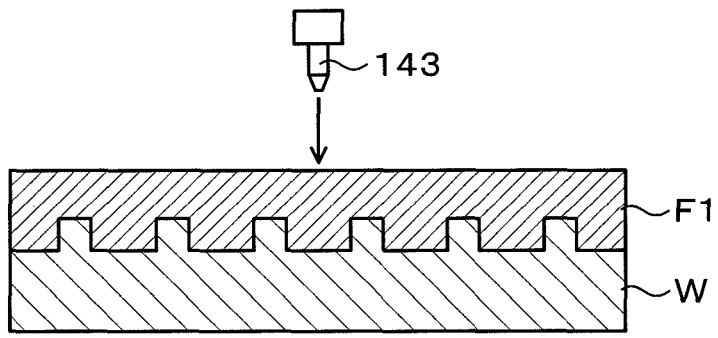
FIG. 16A, FIG. 16B, FIG. 16C, FIG. 16D are explanatory views of a film forming treatment according to another embodiment, FIG. 16A illustrating an appearance in which an organic film is formed on the wafer, FIG. 16B illustrating an appearance in which the organic film is thermally treated, FIG. 16C illustrating an appearance in which the crosslink of the organic film is cut, and FIG. 16D illustrating an appearance in which a metal-containing film is formed on the wafer.

In this case, at the metal-containing film forming unit 120 in the coating treatment apparatus 32, the organic solution is applied from the organic solution nozzle 143 onto the wafer W to form an organic film F1 on the wafer W as illustrated in FIG. 16A. The organic film F1 has not been dried or hardened.

Figure 16B:
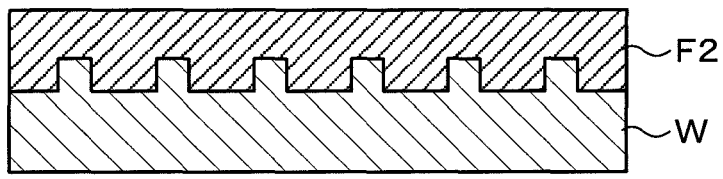
Figure 16C:
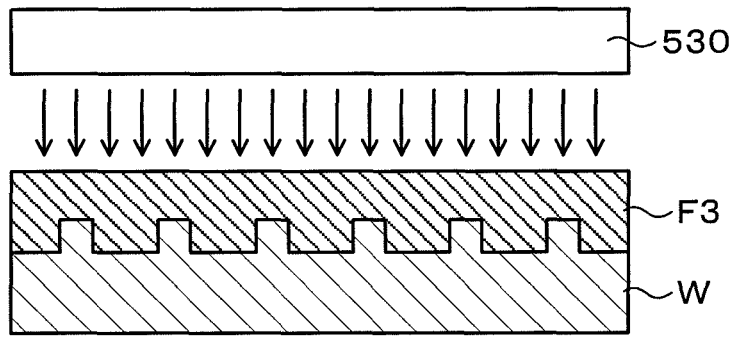

Then, the wafer W is transferred by the wafer transfer apparatus 70 to the thermal treatment apparatus 40 as the thermal treatment unit. In thermal treatment apparatus 40, the wafer W is thermally treated to a predetermined temperature and further temperature-regulated. Then, a thermally treated organic film F2 is formed on the wafer W as illustrated in FIG. 16B.

Then, the wafer W is transferred by the wafer transfer apparatus 70 to the crosslink cutting apparatus 500. After the wafer W is transferred into the crosslink cutting apparatus 500, the wafer W is delivered to the raising and lowering pins 521 which have been raised and waiting in advance. Subsequently, the raising and lowering pins 521 are lowered to mount the wafer W on the mounting table 520. Thereafter, the ultraviolet irradiation part 530 irradiates the organic film F2 on the wafer W with ultraviolet light. The ultraviolet light cuts the crosslink of the organic film F2, whereby an organic film F3 having the crosslink cut and containing OH groups is formed on the wafer W as illustrated in FIG. 16G. Note that the crosslink of the entire organic film F2 is cut in the illustrated example, but the crosslink only in a surface layer of the organic film F2 may be cut. How deep the crosslink of the organic film F2 is cut is set according to the condition of the etching treatment and controlled, for example, by the irradiation time or the like of ultraviolet light to be applied to the organic film F2.

Figure 16D:
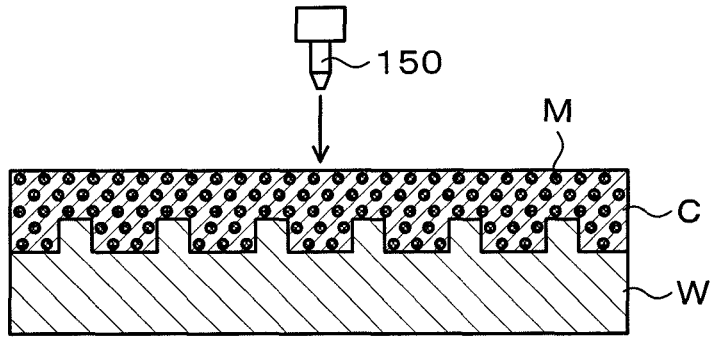

Then, the wafer W is transferred by the wafer transfer apparatus 70 again to the metal-containing film forming unit 120 in the coating treatment apparatus 32. At the metal-containing film forming unit 120, the metal-containing solution in a liquid form is applied from the metal-containing solution nozzle 150 onto the organic film F3 on the wafer W. Then, the alcohol A in the metal-containing solution enters the organic film F3 targeting functional groups excellent in affinity such as OH groups in the organic film F3. Along with the entrance of the alcohol A into the organic film F3, the metal M also enters the organic film F3 using the alcohol A as an entrance route. Then, the metal M bonds with OH groups in the organic film F3, and the metal M infiltrates the organic film F3 as illustrated in FIG. 16D. Thus, a metal-containing film C containing the metal M is formed on the wafer W.

The metal-containing film C having a high etching selection ratio can be appropriately formed on the wafer W also in this embodiment.

Though the crosslink cutting apparatus 500 including the ultraviolet irradiation part 530 is separately provided in the coating and developing treatment system 1 in the above embodiment, the ultraviolet irradiation part 530 may be provided, for example, in the coating treatment apparatus 32 or the thermal treatment apparatus 40.

Though the ultraviolet light is applied to the thermally treated organic film F2 to cut the crosslink of the organic film F2 in the above embodiment, ozone may be supplied to the organic film F2 to cut the crosslink of the organic film F2. For the supply of the ozone, for example, an apparatus similar to the crosslink cutting apparatus 500 is used, in which case it is only necessary to provide an ozone supply part in the crosslink cutting apparatus 500. The ozone supply part may be provided in the coating treatment apparatus 32 or the thermal treatment apparatus 40.

Though the metal-containing solution in a liquid form made by dissolving the metal M in the alcohol A is supplied from the metal-containing solution nozzle 150 to the organic film F3 which has been thermally treated and in which the crosslink has been cut in the above embodiment, the alcohol A in a liquid form from the alcohol nozzle 250 and the metal-containing solution in a liquid form from the metal-containing solution nozzle 251 may be separately supplied. Further, each of the metal-containing solution and the alcohol A may be supplied in a gas form to the organic film F3.

Though alcohol is used as a treatment agent to cause the meal M to enter the organic film F in the above embodiment, the material is not limited to alcohol as long as the material enters the organic film F.

Though the metal M is caused to infiltrate the organic film F to form a metal-containing film C on the wafer W and a resist film is formed on the metal-containing film C in the above embodiment, the organic film F itself may be a resist film. In this case, the metal M is caused to infiltrate the resist film as the organic film F to form a metal-containing film C on the wafer W, thereby omitting separate formation of a resist film.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention.

What is claimed is:

1. A film forming method of formimg a metal-containing film on a Substrate, comprising;
   an organic film forming step of forming an organic film on the substrate; and
   a metal-containing film forming step of forming a metal-containing film by causing a treatment agent to enter the organic film and causing metal to infiltrate the organic film via the treatment agent,
   wherein the organic film is formed by applying an organic solution onto the substrate in the organic film forming step, and the treatment agent is caused to enter the organic film while a solvent in the organic film is being discharged and the metal is caused to infiltrate the organic film via the treatment agent in the metal-containing film forming step.

2. The film forming method according to claim 1, further comprising:
   after the organic film forming step and before the metal-containing film forming step, a solvent adjusting step of adjusting an amount of the solvent in the organic film.

3. The film forming method according to claim 2,
   wherein in the solvent adjusting step, when the amount of the solvent is increased, a solvent is additionally supplied to the organic film, and when the amount of the solvent is decreased, the organic film is thermally treated.

4. The film forming method according to claim 1,
   wherein in the metal-containing film forming step, a metal-containing agent containing the metal in the treatment agent is supplied onto the organic film and is caused to enter the organic film to cause the metal to infiltrate the organic film.

5. The film forming method according to claim 4,
   wherein in the metal-containing film forming step, the metal-containing agent is supplied in a liquid form or in a gas form onto the organic film.

6. The film forming method according to claim 1,
   wherein in the metal-containing film forming step, after the treatment agent is supplied onto the organic film and is caused to enter the organic film, a metal-containing agent containing the metal is supplied onto the organic film to cause the metal to infiltrate the organic film.

7. The film forming method according to claim 6,
   wherein in the metal-containing film forming step, each of the treatment agent and the metal-containing agent is supplied in a liquid form or in a gas form onto the organic film.

8. The film forming method according to claim 1,
   wherein the treatment agent is alcohol.

9. A non-transitory computer readable storage medium storing a program running on a computer of a control unit that controls a film forming apparatus to cause the film forming apparatus to execute a film forming method of forming a metal-containing film on a substrate,
   the film forming method comprising:
   an organic film forming step of forming an organic film on the substrate; and
   a metal-containing film forming step of forming a metal-containing film by causing a treatment agent to enter the organic film and causing metal to infiltrate the organic film via the treatment agent;
   wherein the organic film is formed by applying an organic solution onto the substrate in the organic film forming step, and the treatment agent is caused to enter the organic film while a solvent in the organic film is being discharged and the metal is caused to infiltrate the organic film via the treatment agent in the metal-containing film forming step.

* * * * *